Nov. 26, 1968 KOHJI ITOH ETAL 3,413,507

INJECTION EL DIODE

Filed Nov. 1, 1966 2 Sheets-Sheet 1

INVENTORS
KOHJI ITOH
RYOICHI YAMAMOTO
MASASI INOUE
HISANAO SATO
BY Wenderoth, Lind & Ponack
ATTORNEYS (A) $Cd_{0.77}Mg_{0.23}Te$, (B) CdTe (A) $Cd_{0.77}Mg_{0.23}Te$, (B) CdTe INVENTORS
KOHJI ITOH
RYOICHI YAMAMOTO
MASASHI INOUE
HISANAO SATO
BY Wenderoth, Lind & Ponack
ATTORNEYS

United States Patent Office 3,413,507
Patented Nov. 26, 1968

3,413,507

INJECTION EL DIODE

Kohji Itoh, Kadoma-shi, Osaka-fu, Ryoichi Yamamoto, Neyagawa-shi, Osaka-fu, Masasi Inoue, Nara-shi, and Hisanao Sato, Ibaraki-shi, Osaka-fu, Japan, assignors to Matsushita Electric Industrial Co., Ltd., Osaka, Japan Filed Nov. 1, 1966, Ser. No. 591,264
9 Claims. (Cl. 313—108)

This invention relates to an injection electroluminescence (EL) diode comprising, as an active ingredient, II–VI compounds, and more particularly to a composition of said active ingredient which forms a p-n junction capable of producing an electroluminescence effect.

Much attention has been paid to an EL diode which has a high potential for application in the electronic industry since there appeared the theory of electroluminescence in the literature. Prior literature disclosed various p-n junctions capable of efficient electroluminescence.

Energy of photons emitted from a forward biased p-n junction is generally smaller than the band-gap energy of a host material. Accordingly, it is necessary for producing luminescence effect in the visible range that the host material have a large band gap in the band structure.

A GaP p-n junction is now known to form semiconductor diodes generating the most efficient visible light. However, GaP is an indirect band-gap material and, therefore, has low internal quantum efficiency of recombination-radiation. Further, photon energies thereof are restricted to a limiting value, i.e. to about 2.2 ev. at room temperature (about 15° to about 30° C.) according to its band gap. The II–VI compounds having a large band gap exist in the lattice structures of zinc blende or wurtzite type and are assumed to be direct band-gap materials. Therefore, much attention has been paid to the group II–VI compounds for injection EL light sources.

F. F. Morehead and G. Mandel reported that p-n junctions in CdTe produce an emission having a peak photon energy of 1.45 ev. at 77° K. The photon energy was successively extended to about 1.76 ev. by forming a solid solution of ZnTe in the CdTe, $Zn_xCd_{1-x}Te$ wherein $x=0.4$. As the $x$-value increases, the forward resistance of the diodes comprising said solid solution becomes very high. This may be attributed to an increase in the electrical resistance of an n-type layer of the p-n junction formed in the solid solution with an increase in the $x$-value because n-type ZnTe has a high electrical resistivity. (Efficient electroluminescence from p-n junctions in CdTe at 77° K., Appl. Phys. Letters, 4, 143, 1964; Efficient visible electroluminescence from p-n junctions in $Zn_xCd_{1-x}Te$ Appl. Phys. Letters, 5, 53, 1964.)

It is also reported by M. Aven that p-n junctions in a solid solution of $ZnSe_xTe_{1-x}$ generate an emission having a photon energy of 1.98 ev. when the $x$-value is 0.36. However, limiting values of $x$ can produce a p-type and n-type solid solution of $ZnSe_xTe_{1-x}$ having a low electrical resistivity. (Efficient visible injection electroluminescence from p-n junctions in $ZnSe_xTe_{1-x}$, Appl. Phys. Letters, 7, 146, 1965.)

It is a principal object of this invention to provide a semiconducting solid solution having a band gap changeable continuously with variation in the composition ratio.

It is a further object of this invention to provide a semiconducting solid solution having a band gap sufficiently high for covering the visible range of spectrum.

It is another object of this invention to provide an injection EL diode generating an emission of photon energy higher than that of prior diodes.

Details of the invention will become apparent upon consideration of the following description taken together with the accompanying drawings in which.

It has been discovered according to the invention that CdTe in a zinc blende type structure makes a solid solution with MgTe in a wurtzite type structure, said solid solution being defined by the chemical formula, $Cd_{1-x}Mg_xTe$ wherein the value of $x$ is 0 to 1. Said solid solutions exist in a zinc blende type structure at a low value of $x$ and exist in a wurtzite type structure at a high $x$-value.

The MgTe crystal is known to be transparent but very poor in durability with humidity and air. It easily decomposes into an oxide or hydroxide form when it is in moist air even at room temperature. The poor durability of the MgTe has prevented the practical application thereof and has reduced attention thereto in spite of the desirable transparent characteristics. It has been found that said solid solutions $Cd_{1-x}Mg_xTe$ have a high durability with humidity and air and that the durability increases with decrease in the $x$-value. The $x$-value lower than 0.7 gives solid solutions having a high durability. For example, the solid solution $Cd_{0.5}Mg_{0.5}Te$ does not show any changes in appearance and electrical properties even when it is in water.

Said solid solutions $Cd_{1-x}Mg_xTe$ according to the invention have an absorption edge changeable with variation in the $x$-value.

Figure 1:
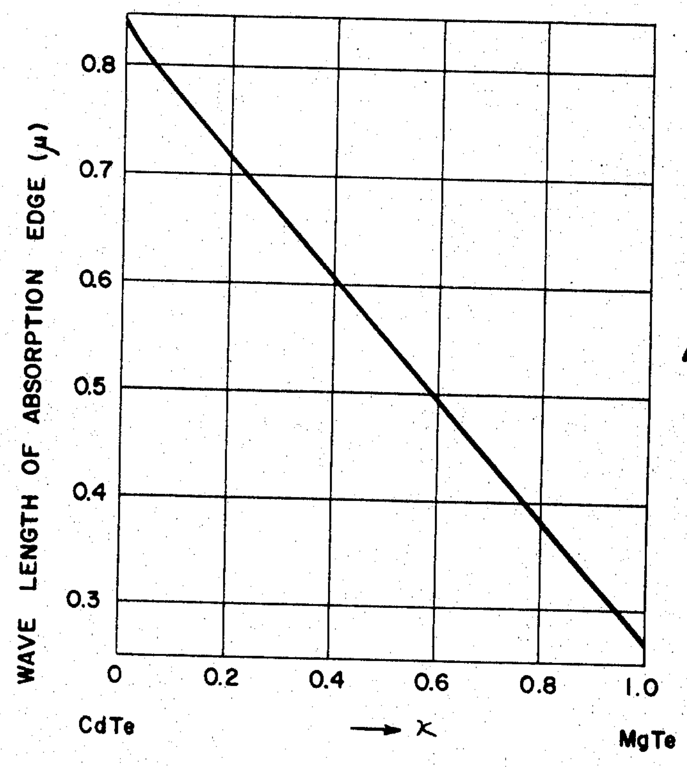
FIG. 1 is a graphic representation of the wave length of the absorption edge versus the mole fraction of MgTe in solid solution of $Cd_{1-x}Mg_xTe$ in accordance with the invention.

Referring to FIG. 1 wherein the wave length of absorption edge is measured in a similar way to that described in, for example, a paper entitled "Optical Absorption of CdS-CdSe Mixed Crystals Prepared by Solid State Diffusion," J. Appl. Phys. vol. 35, 3519–3222 (1964), the wavelength of absorption edge changes from 0.77$\mu$ to 0.40$\mu$ as the $x$-value in the solid solution $Cd_xMg_{1-x}Te$ changes from 0.1 to 0.75. It will be readily understood that said solid solutions can generate an emission having a photon energy ranging from 1.55 ev. to 3.0 ev. when there is formed a p-n junction comprising, as an active ingredient, said solid solutions.

It is important for forming the p-n junction that said solid solutions yield both a p-type semiconductor and an n-type semiconductor having a low electrical resistivity. Said solid solutions exhibit a high electrical resistivity higher than $10^{10}$ ohm-cm. when they are incorporated with no dopants. It has been discovered according to the invention that said solid solutions make an n-type semiconductor having a low electrical resistivity when they are incorporated with a dopant selected from the group consisting of Al, In, Ga, B and I. Preferable dopant is Al which yields an n-type semiconductor having an electrical resistivity lower than 1 ohm-cm. in the $x$-value range of 0.1 to 0.75.

TABLE I

| Atomic percent of doped Al: | Electrical resistivity (ohm-cm.) |
|---|---|
| 0.01 | 1 |
| 0.1 | 0.1 |
| 0.5 | 0.1 |

Table I shows the electrical resistivity of said solid solutions $Mg_xCd_{1-x}Te$ having the $x$-value ranging from 0.1 to 0.75 as a function of atomic percent of doped Al. It will be apparent that operable amount of doped Al is from 0.01 to 0.5 atomic percent and preferable amount of doped Al ranges from 0.1 to 0.5 atomic percent.

The novel solid solutions having the $x$-value of 0.1 to 0.75 can produce a p-type semiconductor having a low electrical resistivity in association with a dopant selected from the group consisting of P and As. Preferable dopant is P. It is difficult to clarify the exact relation between electrical resistivity and an amount of doped P because doping of P is usually carried out by a diffusion process of P vapor deposited on a surface of heated solid solution, and a diffusion coefficient of P is a very low value which makes it difficult to obtain a p-type semiconductor having uniform distribution of doped P. It will be clear from the electrical resistance of a p-type semiconductive layer formed on the surface of said solid solution that doped P produce a p-type semiconductor having the electrical resistivity lower than at least 100 ohm-cm.

Said solid solution can be manufactured by heating a mixture of Mg, Cd and Te of a given composition in a vacuum sealed tube at a temperature of 550° C. to 1200° C. The vacuum referred to herein is a highly reduced pressure of air at least less than $10^{-6}$ mm. Hg in accordance with conventional technical terminology. Starting materials are required to be in a high purity, more than at least 99.999 atomic percent, respectively. It is preferable for making resultant solid solutions more homogeneous that the vacuum sealed tube containing the mixture be heated in a vertical type furnace. Said vacuum sealed tube can be made of quartz. Above 1000° C. of heating temperature the quartz is apt to react with the minor amount of oxides included in the starting materials, respectively. It has been discovered according to the invention that reaction with cadmium oxide can be prevented by replacing the Cd as a starting material with CdTe. Another advantageous method is such that the mixture is accompanied with pyrolytic graphite powder or that the mixture is placed into said vacuum sealed tube having a graphite tube therein.

Single crystals of said solid solutions can be prepared in a similar way to the Bridgman-Stockbarger method. Vacuum sealed tubes containing so-produced solid solutions are moved downward in a temperature gradient of electric furnace at a rate of 5 to 10 mm./hour. A preferable temperature gradient is such that a high temperature of 1300 to 1100° C. is spaced from a low temperature of 1150° to 950° C. by a distance of 100 mm. to 300 mm. Said high temperature depends upon the melting point of said solid solutions which increase with an increase in the $x$-value. For example, a solid solution $Cd_{0.7}Mg_{0.3}Te$ has a melting point of about 1130° C. Since said solid solutions have, in the temperature range of 1100° C. to 1300° C., a vapor pressure lower than one atmospheric pressure, the vacuum sealed tube can be made of quartz having a sufficient resistance to atmospheric pressure.

An n-type semiconductor having a dopant such as Al, In, Ga and I can be prepared in a similar way to that of undoped solid solutions described above. Staring mixture of Mg, Cd, Te and the dopant in a given composition is heated in a vacuum sealed quartz tube at a temperature of 550° to 1200° C. The resulting solid solutions are treated by the aforesaid Bridgman-Stockbarger method for making single crystals.

Figure 2:
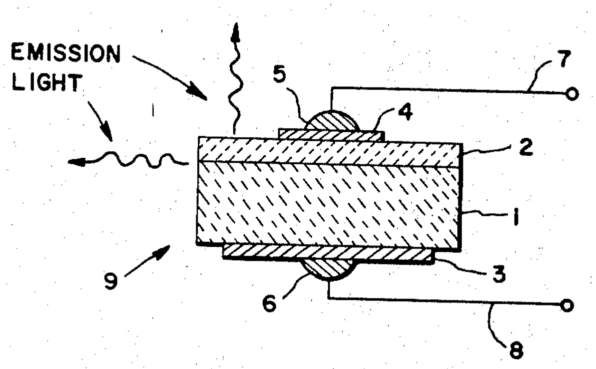
FIG. 2 is a cross-sectional view of an injection EL diode comprising novel solid solution.

It has been discovered according to the invention that the aforesaid n-type semiconductors comprising, as an active ingredient, solid solutions $Cd_{1-x}Mg_xTe$ form a p-n junction adapted for injection EL diode in association with aforesaid p-type semiconductors integrated on the surface of said n-type semiconductors. Even polycrystal n-type semiconductors can form a said p-n junction. It is preferable for making an injection EL diode of a high efficiency to employ single crystals of n-type semiconductor. As seen from the preceding description, operable $x$ value in the $Cd_{1-x}Mg_xTe$ ranges from 0.01 to 0.75 and operable dopant is a member selected from the group consisting of Al, In, Ga and I. In view of the preparation of injection EL diode, it is preferable that 0.01 to 0.5 atomic percent of Al is doped with the solid solutions having 0.01 to 0.75 of $x$-value. Referring to FIG. 2, an n-type semiconductor wafer 1 according to the invention is adherent to a p-type semiconductor layer 2 which is formed in a manner set forth hereinafter. Said p-type semiconductor layer 2 is provided with an electrode 4 such as Au by employing conventional electroless plating. It is preferable for enlarging a light generating area of the diode that said electrode 4 be in a small area such as a spot. There may be used any materials and applying methods which produce an ohmic contact with said p-type semiconductor layer. Said n-type semiconductor wafer 1 is coated at a surface with an electrode 3 which is in an ohmic contact with the wafer 1. Operable electrodes are In electrode vacuum-deposited and Ni electrode prepared by conventional electroless plating. Since electrodes 3 and 4 are connected to lead wires 7 and 8 by using conventional solders 5 and 6.

Said lead wires 7 and 8 are connected to an electronic supply source. The injection EL diode 9 generates an emission having a photon energy depending upon the $x$-value of the solid solutions $Cd_{1-x}Mg_xTe$ and upon the characteristics of the p-n junction.

Said p-n junction can be prepared by diffusion process of a dopant selected from the group consisting of P and As. Since such a dopant has a high vapor pressure, the diffusion process can be performed in a vacuum sealed quartz tube containing the aforesaid n-type semiconductor wafer comprising the aforesaid solid solution incorporated with aforesaid dopant. A wafer cut from the single crystal is polished and etched in such a way that the polished wafer is etched with a mixture of $HNO_3$ and $H_3PO_4$, washed with water, etched in a mixture of NaOH and $Na_2S_2O_3$ and then finally treated with a dilute alcoholic solution of HCl in an organic solvent such as acetone, benzene and trichlene. The etched wafer and the dopant in said vacuum sealed quartz tube are heated at 800° to 900° C. for 3 to 15 days, so as to produce a p-type semiconductor layer laminated on the surface of said n-type semiconductor wafer. The dopant is necessary to be spaced from the single crystal wafer by a distance of at least 10 mm. The dopant is preferably kept at a temperature lower by at least 10° C. than that of the single crystal wafer. In view of the emission generation of the resultant EL diode, the thickness of said p-type semiconductor layer is necessary to be 2 to 50$\mu$. Therefore it is important for obtaining operable thickness to control the combination of the heating temperature and heating time.

Since P has a higher diffusion coefficient into n-type semiconductive solid solutions than As, P is superior to As in the manufacturing process. A high vapor pressure of P at the heating temperature can be lowered by adding Cd to the P in said vacuum sealed quartz tube. The addition of Cd also can prevent the vaporization of Cd from the wafer composition. It has been discovered according to the invention that a further addition of Mg or powder of solid solutions having the same $x$-value as that of the wafer can prevent the wafer surface from being thermally etched during heating.

An EL diode produced by the invention can be used for EL lamp, semiconductor laser, photovoltaic cell, photodetector and other optoelectronic devices.

The following examples are given to illustrate certain preferred details of the invention, it being understood that the details of the examples are not to be taken as in any way limiting the invention thereto.

*Example 1*

A quartz tube 20 mm. I.D. (internal diameter) and 150 mm. (millimeters) long is coated, at the inner surface, with pyrolytic graphite. Into the tube are placed 1.82 g. (grams) of Mg, 9.57 g. of Te, and 36 g. of CdTe. Then the tube is evacuated and sealed off. The tube is placed vertically in an electric furnace and heated about 12 hours at about 1100° C. The resultant ingot is red-colored polycrystalline solid solution defined by the chemical formula $Cd_{0.67}Mg_{0.33}Te$. The resultant solid solution has an absorption edge of 0.64μ (micrometer).

*Example 2*

25 g. of finely-divided powder of the solid solution obtained in Example 1 are placed into 10 mm. I.D., 100 mm. long quartz tube coated with pyrolytic graphite. The tube is then evacuated and sealed off. The tube is placed into a vertical Bridgman apparatus having a temperature gradient wherein high temperature of 1160° C. is spaced by 100 mm. from a low temperature. The tube is moved downward from the high temperature to the low temperature at a rate of 10 mm./hr. (millimeters per hour).

The obtained ingot comprises several single crystals having an average diameter of 5 mm. and an average length of 10 mm. The crystal has the zinc blende structure and a good cleavage quality at (110) plane.

*Example 3*

A solid solution is prepared from a mixture of 3.66 g. of Mg, 19.1 g. of Te, and 24 g. of CdTe in a similar way to that of Example 1. The resultant solid solution is of the composition, $Cd_{0.4}Mg_{0.6}Te$. Finely-divided powders of the solid solutions are placed into a graphite crucible (12 mm. I.D., 16 mm. O.D. (outer diameter), 100 mm. long). The crucible is then placed into a 17 mm. I.D., 200 mm. long quartz tube having a sealed end and an open end. The solid solution in the quartz tube is heated at about 1260° C. under 60 atm. (atmospheres) of argon in a furnace having a graphite heater, and is moved downward to a low temperature of 100° C. at a rate of 8 mm./hr., said low temperature being spaced by 80 mm. from the high temperature of 1260° C. The obtained ingot comprises yellow single crystals having a rectangular rod of 4 x 4 x 8 mm. The wave length of absorption edge is 0.5μ.

*Example 4*

A mixture of Cd, Mg, Te and Al in a composition to produce $Cd_{0.75}Mg_{0.25}Te$ doped with 0.1 atomic percent of Al is heated in the same way as in Example 1. The resultant n-type solid solution is treated by the Bridgman method in a similar way to that in Example 2 so as to produce a single crystal. So obtained single crystal is placed into a vacuum sealed tube including Cd powder in such a way that the single crystal is spaced by 20 mm. from the Cd powder. The vacuum sealed tube is heated in a horizontal furnace at 800° C. for 20 hours in such a way that the temperature of Cd powder is lower by 20° C. than that of the single crystal. The resultant single crystal is in a rod form of 3 x 3 x 8 mm. and has an electrical resistivity of 0.1 ohm-cm. (ohm-centimeter) and absorption edge of 0.69μ.

*Example 5*

A mixture of Cd, Mg, Te and Al in a composition to produce $Cd_{0.77}Mg_{0.23}Te$ doped with 0.05 atomic percent of Al is heated in a similar way to that of Example 1. The resultant n-type solid solution is treated by the Bridgman method in a similar way to that of Example 2 so as to produce a single crystal. A wafer (3 x 3 x 0.5 mm.) is prepared by polishing and etching said crystal. The etching process is as follows: the crystal is etched with a mixture of $HNO_3$ and $H_3PO_4$, washed with water, etched in a mixture of NaOH and $Na_2S_2O_3$, and then treated with a dilute solution of HCl.

The wafer is put into an evacuated sealed quartz tube with 150 mg. (milligrams) of Cd and 0.4 mg. of P and is heated at 850° C. for 10 days for forming a p-type semiconductive layer on the surface of said wafer. The thickness of the so-produced p-type semiconductive layer is about 30μ.

The resultant wafer comprising a p-n junction therein is provided with electrodes in a manner described in connection with FIG. 2, after polishing. The Au electrode is applied to the surface of p-type semiconductive layer by a conventional electroless plating method. The In electrode is applied to the surface of n-type semiconductive wafer by an evaporation method.

Figure 3:
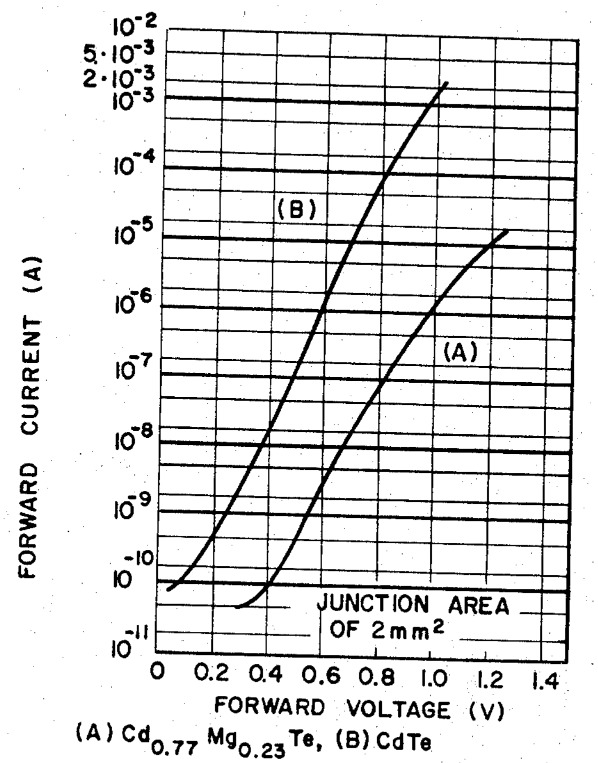
FIG. 3 is a graphic illustration of voltage versus current characteristic of the diode of FIG. 2.
Figure 4:
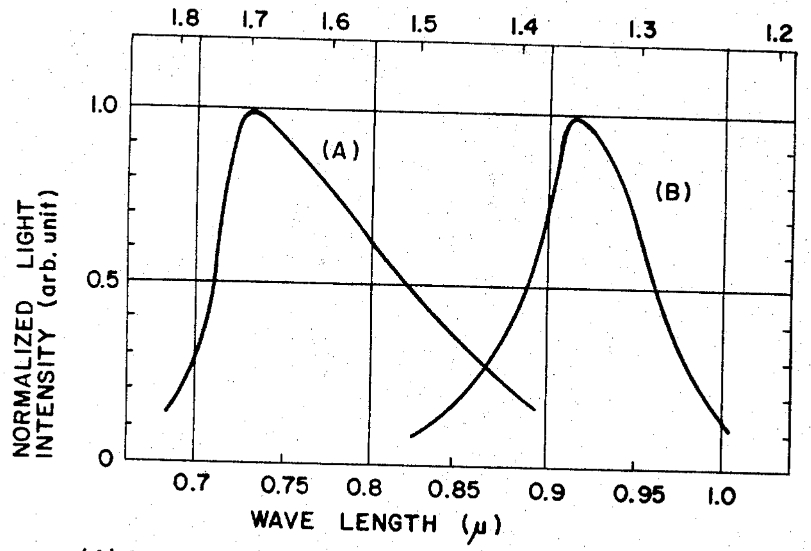
FIG. 4 is a graphic representation of the emitted light intensity versus the wave length of the diode of FIG. 2.

FIG. 3 and FIG. 4 show the V-I characteristics and the emission characteristics of the resultant EL diode in comparison with those of a prior EL diode comprising CdTe. The novel EL diode according to the invention has a forward current lower than that of the prior EL diode because the solid solution $Cd_{0.77}Mg_{0.23}Te$ has a band gap larger than that of CdTe. It is clear from FIG. 4 that since the solid solution and CdTe have absorption edges of 0.7μ and 0.84μ, respectively, the emission peaks differ between the novel EL diode and the CdTe diode.

What is claimed is:

1. An injection EL diode comprising, as an active ingredient, a solid solution of CdTe and MgTe.

2. An injection EL diode as defined in claim 1, wherein said solid solution is of the composition of $Cd_{1-x}Mg_xTe$ where $x$ is 0.01 to 0.75.

3. An injection EL diode comprising a p-n junction consisting of an n-type solid solution of CdTe and MgTe and a p-type solid solution of CdTe and MgTe.

4. An injection EL diode as defined in claim 3, wherein said p-n junction consists of a thin layer of a p-type solid solution of CdTe and MgTe on a surface of a wafer of a single crystal of n-type solid solution of CdTe and MgTe.

5. An injection EL diode as defined in claim 3, wherein said n-type solid solution of CdTe and MgTe includes, as a dopant, a metal selected from the group consisting of Al and In.

6. An injection EL diode as defined in claim 3, wherein said n-type solid solution of CdTe and MgTe includes, as a dopant 0.01 to 0.5 atomic percent of Al.

7. An injection EL diode as defined in claim 3, wherein said n-type solid solution of CdTe and MgTe is a wafer including, as a dopant, Al and said p-type solid solution of CdTe and MgTe is a thin layer which includes, as a dopant, P, and is laminated on said wafer.

8. A method for making an injection EL diode comprising providing a wafer of n-type solid solution of CdTe and MgTe including, as a dopant, Al, heating said wafer in a vapor phase of P and Cd at 800° to 900° C. for 3 to 15 days so as to laminate a thin layer of p-type solid solution of CdTe and MgTe on the surface of said wafer and applying electrodes to opposite surfaces of the laminated wafer.

9. A method for making an injection EL diode comprising providing a wafer of a single crystal of n-type solid solution of CdTe and MgTe including, as a dopant, 0.01 to 0.3 atomic percent of Al, etching said wafer with a mixture of $HNO_3$ and $H_3PO_4$, washing said wafer with water, etching said wafer with a mixture of NaOH and $Na_2S_2O_3$, treating said wafer with a dilute solution of HCl, heating said wafer in a sealed evacuated tube containing a mixture of Cd and P in a weight ratio of 500:1 to 50:1 at 800 to 850° C. for 5 to 10 days so as to laminate a thin layer of p-type solid solution of CdTe and MgTe having a thickness of 2 to 50μ on the surface of said wafer and applying electrodes to opposite surfaces of the laminated wafer.

No references cited.

JAMES W. LAWRENCE, *Primary Examiner.*

R. F. HOSSFELD, *Assistant Examiner.*